(12) United States Patent
Won et al.

(10) Patent No.: US 7,481,882 B2
(45) Date of Patent: Jan. 27, 2009

(54) METHOD FOR FORMING A THIN FILM

(75) Inventors: Seok-jun Won, Seoul (KR);
Young-wook Park, Kyungki-do (KR);
Yong-woo Hyung, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/131,761

(22) Filed: Apr. 23, 2002

(65) Prior Publication Data
US 2002/0115306 A1    Aug. 22, 2002

Related U.S. Application Data

(62) Division of application No. 09/350,407, filed on Jul. 8, 1999, now Pat. No. 6,416,584.

(30) Foreign Application Priority Data
Jul. 9, 1998    (KR) ............................. 1998-27663

(51) Int. Cl.
*H01L 21/285* (2006.01)
*H01L 27/10* (2006.01)

(52) U.S. Cl. ............................ 117/97; 117/4

(58) Field of Classification Search ............ 117/89, 117/97, 102, 4–9, 1; 438/166, 472
See application file for complete search history.

(56) References Cited

U.S. PATENT DOCUMENTS

| | | | |
|---|---|---|---|
| 3,464,797 A | | 9/1969 | Hagopian ................. 436/135 |
| 4,636,908 A | * | 1/1987 | Yoshihara et al. ......... 361/321.4 |
| 5,091,217 A | | 2/1992 | Hey et al. ................ 427/248.1 |
| 5,213,670 A | * | 5/1993 | Bertagnolli et al. .... 204/192.25 |
| 5,728,603 A | * | 3/1998 | Emesh et al. ................ 438/3 |
| 5,858,837 A | * | 1/1999 | Sakoh et al. ............... 438/255 |
| 5,872,065 A | | 2/1999 | Sivaramakrishnan ........ 438/784 |
| 5,902,403 A | | 5/1999 | Aitani et al. ............... 156/345 |
| 5,910,218 A | * | 6/1999 | Park et al. .................. 118/719 |
| 6,066,547 A | * | 5/2000 | Maekawa .................. 438/486 |

(Continued)

FOREIGN PATENT DOCUMENTS

JP    02296793    12/1990    ............... 118/719

(Continued)

OTHER PUBLICATIONS

Machine Translation of KR10-1997-030378. Park et al published Jun. 26, 1997. 11 pages.*

(Continued)

*Primary Examiner*—Sylvia R. MacArthur
(74) *Attorney, Agent, or Firm*—Harness, Dickey & Pierce, P.L.C.

(57) ABSTRACT

A method for forming a film includes forming the film on a substrate, followed by performing a first annealing of the film at a temperature lower than a crystallization temperature of the film. A second annealing of the film is performed at a temperature higher that the crystallization temperature. Forming the film and the first annealing of the film are performed in situ in a chamber. Alternatively, the first and second annealing are performed in situ in an apparatus.

21 Claims, 6 Drawing Sheets

U.S. PATENT DOCUMENTS

| | | | |
|---|---|---|---|
| 6,099,647 A | 8/2000 | Yieh et al. | 118/697 |
| 6,162,667 A * | 12/2000 | Funai et al. | 438/166 |
| 6,165,872 A * | 12/2000 | Kageyama | 438/455 |
| 6,204,203 B1 * | 3/2001 | Narwankar et al. | 438/785 |
| 6,228,502 B1 * | 5/2001 | Saitoh et al. | 428/472 |
| 6,274,454 B1 * | 8/2001 | Katori | 438/396 |
| 6,416,584 B1 * | 7/2002 | Won et al. | 118/715 |
| 6,426,308 B1 * | 7/2002 | Park et al. | 438/785 |
| 6,461,982 B2 * | 10/2002 | DeBoer et al. | 438/778 |
| 6,465,288 B1 * | 10/2002 | Ohnuma | 438/166 |
| 6,500,742 B1 * | 12/2002 | Chern et al. | 438/582 |
| 6,706,568 B2 * | 3/2004 | Nakajima | 438/149 |

FOREIGN PATENT DOCUMENTS

| | | | |
|---|---|---|---|
| JP | 10200060 A | * | 7/1998 |
| KR | 96-15581 | | 11/1996 |
| KR | 19970030378 | * | 6/1997 |

OTHER PUBLICATIONS

Hiroshi Shinriki and Masayuki Nakata: "UV-$O_3$ and Dry-$O_2$: Two-Step Annealed Chemical Vapor Deposited $Ta_2O_5$ Films for Storage Dielectrics of 64-Mb DRAM's", IEEE Transactions On Electron Devices, vol. 38, No. 3, Mar. 1991.

US 6,924,507, 08/2005, Murakami et al. (withdrawn)*

* cited by examiner

METHOD FOR FORMING A THIN FILM

CROSS REFERENCE TO RELATED APPLICATION

This application is a division of and claims priority from U.S. patent application Ser. No. 09/350,407, filed Jul. 8, 1999 now U.S. Pat. No. 6,416,584, entitled, "Reaction Chamber and Method for Forming a Thin Film", which claims priority from Korean Patent Application number 1998-27663 filed Jul. 9, 1998.

BACKGROUND OF THE INVENTION

1. Field of the Invention

The present invention relates to manufacturing of a semiconductor device, and more particularly, forming of a thin film such as a dielectric film in a capacitor.

2. Description of the Related Art

The capacitance (C) of a capacitor is proportional to the area (A) of the capacitor's electrodes and a dielectric constant ($\in$) of a dielectric material between the electrodes, and inversely proportional to distance (d) between the electrodes, as shown in the following equation.

$$C \propto \epsilon(A/d)$$

Thus, increasing the area (A) of electrodes, using a dielectric film having a high dielectric constant, or decreasing the distance between the electrodes can increase the capacitance (C) of the capacitor.

As semiconductor devices become more highly integrated, the areas available for capacitor formation within semiconductor devices become smaller. Accordingly, techniques have been developed for increasing the capacitance of capacitors formed in small areas. One technique uses three-dimensional electrodes to increase the area (A) of the electrodes, but the three-dimensional electrodes are subject to structural restrictions. Use of a dielectric film having a high dielectric constant ($\epsilon$) can increase the capacitance (C) of a capacitor and permit high semiconductor integration. In addition, a thinner dielectric film reduces the distance (d) between electrodes and produces higher capacitance of a capacitor, but reducing the distance (d) between the electrodes often has the drawback of increasing the leakage current of the capacitor.

Recently, tantalum oxides, such as a tantalum pentoxide ($Ta_2O_5$) having a high dielectric constant ($\epsilon$), have been tried as dielectric films for capacitors. However, with a tantalum pentoxide film, leakage current can be large when the film is thin. A problem with tantalum pentoxide is non-uniform film deposition, and oxygen and carbon impurities often allow the leakage current through weak portions of the tantalum pentoxide film. To solve the leakage problem, several methods have been suggested. Among the suggested methods is a dry-oxygen (dry-$O_2$) annealing, and a low temperature ultraviolet-ozone (UV-$O_3$) annealing at 500° C. or less followed by a dry-oxygen annealing. IEEE Transactions on Electron Devices, Vol. 38, No. 3, March 1991, entitled "UV-$O_3$ and Dry-$O_2$: Two-Step Annealed Chemical Vapor Deposited $Ta_2O_5$ Films for Storage Dielectrics of 64-MB DRAM's", by Shinriki and Masayuki Nakata, which is hereby incorporated by reference in its entirety, discloses the latter method. In the known methods, formation and UV-$O_3$ annealing of the tantalum oxide film are respectively performed in separate chambers shown in FIGS. 1 and 2.

Figure 1:
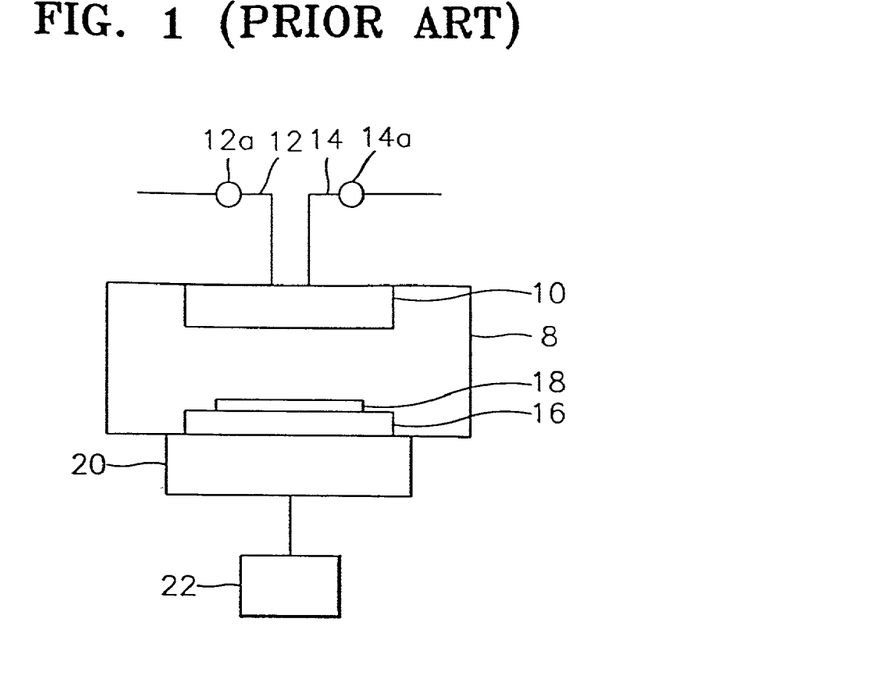
FIG. 1 is a partial sectional view of a conventional reaction chamber for forming a dielectric film.
Figure 2:
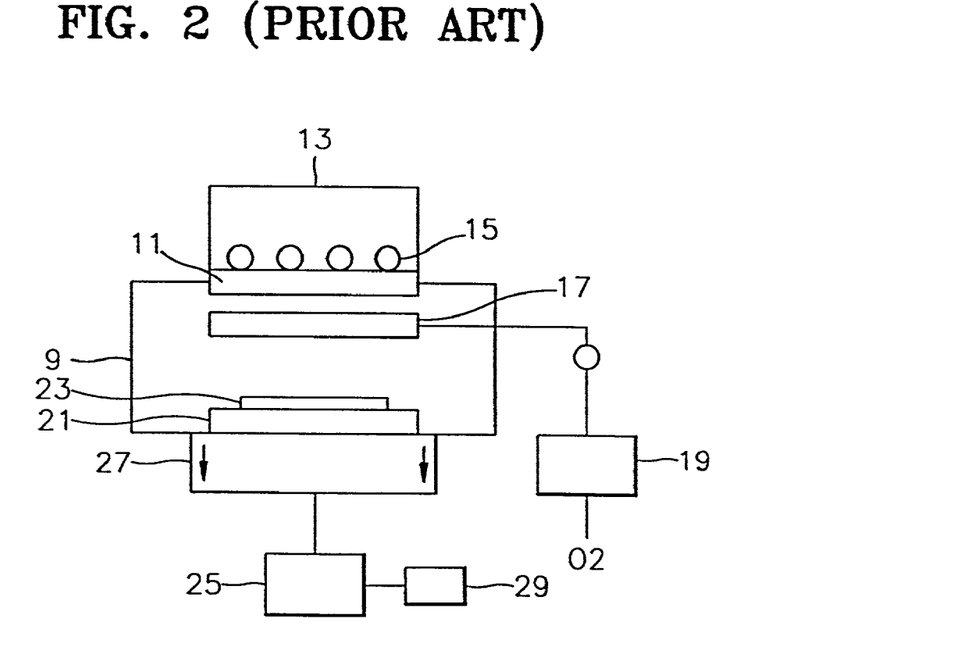
FIG. 2 is a partial sectional view of a conventional chamber for UV-$O_3$ annealing.

Referring to FIG. 1, a chamber 8 for forming a tantalum oxide film includes a shower head 10 in an upper portion of chamber 8. Shower head 10 receives pentaethoxytantalum as a source gas for the tantalum oxide film from a supply line 12 and oxygen ($O_2$) as a reaction gas from a second gas supply line 14. A first valve 12a and a second valve 14a are in the first and second gas supply lines 12 and 14, respectively. A susceptor 16 is on the floor of the chamber 8 for mounting of a wafer 18. A pumping line 20 connects to the bottom of the chamber 8, and a pump 22 attaches to the pumping line 20. After forming the tantalum oxide film, wafer 18 becomes a wafer 23, which is transferred to an annealing chamber 9 (FIG. 2). In annealing chamber 9, a UV-$O_3$ annealing is performed on the tantalum oxide film.

Referring to FIG. 2, UV-annealing chamber 9 includes a quartz window 11 on the ceiling thereof. A UV lamp housing 13 includes a UV lamp 15 for generating UV rays that pass through quartz window 11 into chamber 9. A shower head 17 below quartz window 11 is also made of quartz to uniformly pass UV rays into chamber 9. Shower head 17 supplies a gas mixture containing oxygen ($O_2$) and ozone ($O_3$) gases that form an oxide film with a uniform thickness. Shower head 17 connects to an ozonizer 19 installed outside chamber 9. A susceptor 21 is on the floor of chamber 9 and below shower head 17, and wafer 23 having the tantalum oxide film is on susceptor 21. An ozone decomposer 25 connects to a bottom of chamber 9 via a pumping line 27, and a pump 29 connects to ozone decomposer 25.

As described above, the conventional method forms a tantalum oxide film and uses a separate chamber for a UV-annealing to remove defects from the tantalum oxide film.

SUMMARY OF THE INVENTION

In accordance with an embodiment of the present invention, an apparatus for forming a dielectric film on a semiconductor substrate includes a shower head on in a reaction chamber, and a mounting stand in the reaction chamber, below the shower head. The semiconductor substrate is loaded on the mounting stand. A first gas line for supplying a source gas for depositing the dielectric film and a second gas supply line for supplying a reaction gas for depositing the dielectric film and an annealing gas, typically ozone, for annealing the dielectric film connect to the shower head.

When the dielectric film is a composite dielectric film, the first gas supply line may include several lines, which supply respective source gases for the layers of the composite dielectric film. An ozonizer connects to the second gas supply line in parallel. The second gas supply line can include respective gas supply lines for supplying the reaction gas and the annealing gas.

A supply line for an inert gas such as nitrogen ($N_2$) or argon (Ar) gas may connect to the second gas supply line for purging the reaction chamber and the second gas supply line. The inert gas supply line and the second gas supply line can respectively include mass flow controllers (MFCs). An ozone decomposer connects to the reaction chamber via a pumping line between the ozone decomposer and the bottom of the reaction chamber. A pump connects to the ozone decomposer.

The apparatus may further include a second pumping line, which bypasses the ozone decomposer, to protect the ozone decomposer from contamination caused by gas discharged during deposition of a dielectric film. The ozone decomposer connects to the ozonizer via an ozone purifying line, and a control valve on the pumping line directs the gas flow from the reaction chamber to the second pumping line or the ozone decomposer.

According to another embodiment of the present invention, a reaction chamber includes five (first through fifth) semiconductor substrate mounting stands. Each of the second through fifth semiconductor substrate mounting stands faces respective shower heads. The chamber also includes a gas spraying means capable of forming air curtains of an inert gas around the shower heads.

According to an aspect of the invention a method for forming a dielectric film includes (a) depositing a dielectric film on a semiconductor substrate, (b) annealing the dielectric film at a temperature lower than a crystallization temperature of the film, and (c) annealing the dielectric film at a temperature higher than the crystallization temperature. When a tantalum oxide dielectric film is formed, the tantalum oxide film is first annealed at approximately 450° C. in an ozone or oxygen atmosphere and then annealed in a dry-oxygen or wet-oxygen atmosphere.

The steps (a) and (b) or the steps (a), (b), and (c) can be performed in situ in an apparatus. In particular, a reaction chamber including a shower head for source and annealing gases and a susceptor for heating the semiconductor substrate can perform steps (a) and (b). A first gas supply line that supplies a source gas for forming the dielectric film and a second gas supply line that supplies a reaction gas for forming the dielectric film and an annealing gas connect to the shower head. A second dielectric film may be further formed on the dielectric film and then annealed in situ in the same chamber. In the step (b), the semiconductor substrate can be annealed by a resistance heating or a lamp heating method. The source gas typically comprises a metal oxide gas corresponding to one selected from a group consisting of tantalum oxides such as pentaethoxytantalum ($Ta(OC_2H_5)_5$), titanium oxides and aluminum oxides. When a tantalum oxide gas is the source gas, oxygen ($O_2$) and ozone ($O_3$) gases are the reaction gas and the annealing gas, respectively. In the step (a), the first gas supply line supplies the source gas, and the second gas supply line supplies the reaction gas. When there is a large difference in processing pressure between the steps (a) and (b), a turbo molecular pump (TMP) reduces the time required for adjusting the pressure between steps (a) and (b).

Steps (a) and (b) can be performed in situ in the above-described reaction chamber using five semiconductor substrate mounting stands. One such process performs steps (a) and (b) while a semiconductor substrate remains on the same mounting stand. In this case, the steps (a) and (b) include the sub-steps of: pre-heating the semiconductor substrate having the thin film on the first semiconductor substrate mounting stand; and forming and annealing the dielectric films on the pre-heated semiconductor substrate.

Steps (a) and (b) can also be performed on different semiconductor substrate mounting stands. For example, the steps (a) and (b) include the sub-steps of pre-heating a semiconductor substrate having the thin film on the first semiconductor substrate mounting stand, forming dielectric films on the semiconductor substrate while on the second and fourth stands, and annealing the dielectric films when substrates are on the third and fifth semiconductor substrate mounting stands.

Steps (a), (b), and (c) can be performed in situ in a furnace or in rapid thermal processing (RTP) equipment.

For a tantalum oxide dielectric film, step (b) may be performed at between about 500 and about 700° C., preferably, 600° C., in an oxygen atmosphere, and step (c) may be performed at between about 700 and about 900° C., preferably, 800° C., in an oxygen atmosphere.

According to another embodiment of the invention, a method for forming a dielectric film includes (a) forming a dielectric film on a semiconductor substrate and (b) annealing the dielectric film. For this method, step (b) is performed at a temperature near the crystallization temperature of the dielectric film in an ozone atmosphere, and the dielectric film can be formed of tantalum oxide at between about 500 and about 700° C., preferably, 600° C., in an ozone atmosphere.

According to still another embodiment of the invention, a method for forming a dielectric film includes (a) forming a dielectric film on a semiconductor substrate, (b) annealing the dielectric film at a temperature lower than the crystallization temperature of the film, and (c) second-annealing the dielectric film at a temperature higher than the crystallization temperature, wherein the steps (b) and (c) are performed in situ in the same apparatus.

In the above embodiments, the material of the dielectric film is selected from the group consisting of tantalum oxide ($Ta_2O_5$), titanium oxide ($TiO_2$), aluminum oxide ($Al_2O_3$), yttrium oxide, vanadium oxide and niobium oxide.

As described above, embodiments of the present invention share one gas supply for both forming and annealing of a thin dielectric film, and forming and annealing of the thin film are performed in situ in a chamber having the shared gas supply. Accordingly, the present invention can reduce the processing time of the thin film, thereby improving the productivity of a semiconductor device manufacturing process. In addition, inflow of impurities into the thin film is reduced, and equipment for forming and annealing of the thin film is simplified, reducing the amount of equipment required.

BRIEF DESCRIPTION OF THE DRAWINGS

The advantages of the present invention will become more apparent by describing in detail embodiments thereof with reference to the attached drawings in which.

In the drawings, the thickness of layers and regions are exaggerated for clarity, and the same reference numerals in different drawings represent the same or similar elements.

DESCRIPTION OF THE PREFERRED EMBODIMENTS

The present invention is described more fully with reference to the accompanying drawings, which illustrate embodiments of the invention. This invention may, however, be embodied in many different forms and should not be construed as being limited to the embodiments set forth herein; rather, these embodiments are provided so that this disclosure will be thorough and complete, and will convey the invention to those skilled in the art. It will also be understood that when a layer is referred to as being "on" another layer or substrate, the former can be directly on the latter, or intervening layers may also be present.

Prior to describing an apparatus for forming a dielectric film and a method for forming the dielectric film according to the present invention, the change in leakage current density of a dielectric film, e.g., a tantalum oxide ($Ta_2O_5$) film, according to the annealing method, is described.

Figure 3:
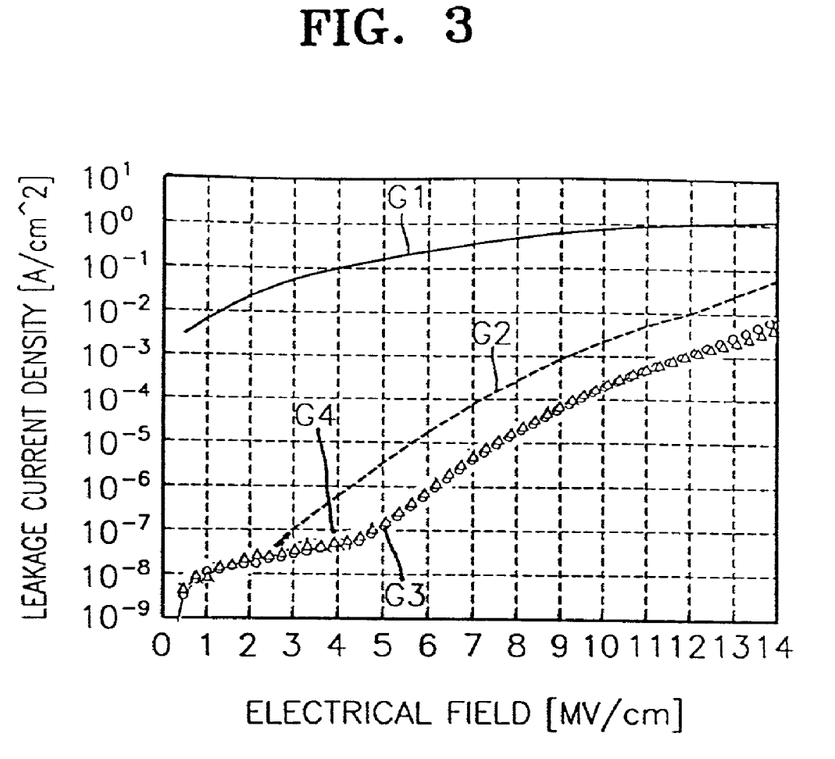
FIG. 3 is a graph showing change of a leakage current density after treatment of tantalum oxide films.

Referring to FIG. 3, a tantalum oxide film was formed on a semiconductor substrate to a thickness of 90 Å. Leakage current densities of the tantalum oxide film were measured after four treatment methods.

In detail, first, the leakage current density of a tantalum oxide film (G1) which had only pretreatment without annealing was measured. Second, leakage current density of a tantalum oxide film (G2) which had been dry-annealed at 800° C. was measured. Third, leakage current density of a tantalum oxide film (G3) which had dry-annealing at 800° C. after UV-annealing at 450° C. was measured. Fourth, leakage current density of a tantalum oxide film (G4) which has been dry-annealed at 800° C. after annealing at 450° C. was measured. The results are shown in FIG. 3.

The tantalum oxide film with no annealing (G1) shows much higher leakage current density than the annealed tantalum oxide films (G2, G3 and G4). The $UV-O_3$ annealing (G3) or $O_3$ annealing (G4) followed the dry-$O_2$ annealing at 800° C. resulted in lower leakage current density than the dry-$O_2$ annealing at 800° C. (G2).

The almost identical results from G3 and G4 suggest that regardless of whether the initial annealing is $UV-O_3$ or $O_3$ annealing, when the tantalum oxide film is annealed again, the tantalum oxide film shows a low leakage current density. Thus, an apparatus for UV-ray production can be omitted in annealing the tantalum oxide film. In addition, a reaction chamber capable of forming and annealing a thin film in situ can reduce the number of the thin film formation steps.

FIGS. 4 to 7 show methods for forming a dielectric film in accordance with specific embodiments of the present invention.

Figure 4:
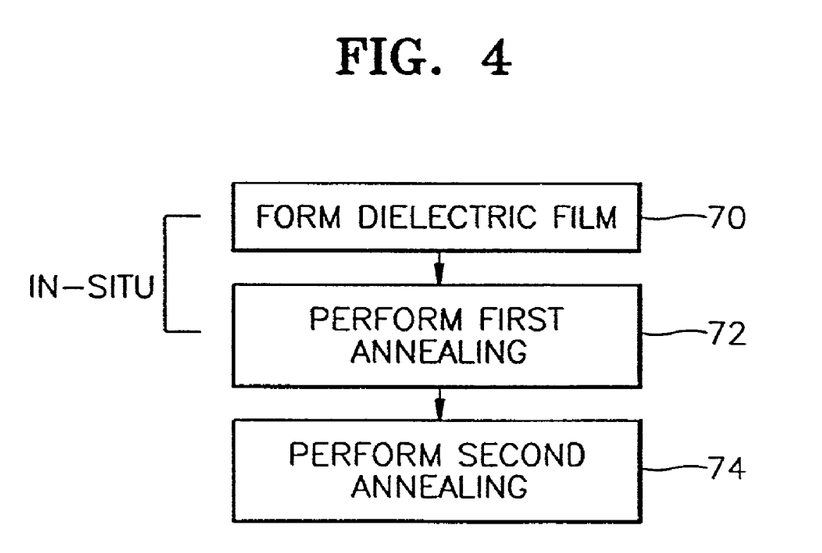
FIGS. 4 through 8 are flowcharts illustrating thin film formation methods according to embodiments of the present invention.

Referring to FIG. 4, an initial step 70 deposits a dielectric film on, for example, a lower electrode of a capacitor, which is formed on a semiconductor substrate. The material of the dielectric film is selected from a group consisting of a tantalum oxide (e.g., $Ta_2O_5$), a titanium oxide (e.g., $TiO_2$), an aluminum oxide (e.g., $Al_2O_3$), an yttrium oxide, a vanadium oxide and a niobium oxide. After step 70, a first annealing of the dielectric film is performed in step 72. Steps 70 and 72 are performed in situ in the same reaction chamber in which the dielectric film was deposited. The first annealing is at a temperature lower than the crystallization temperature of the dielectric film. For example, if the dielectric film is the tantalum oxide film, the first annealing is performed at between about 200° C. and about 700° C., preferably, approximately 450° C. The first annealing is in an ozone ($O_3$) or oxygen ($O_2$) environment. The in situ process of steps 70 and 72 can eliminate the time required for opening/closing the reaction chamber in each step and moving the substrate into another chamber. The in situ process also prevents contamination of the semiconductor substrate that may otherwise occur when the chambers are opened or the substrate is moved.

After the first annealing (step 72), a second annealing of the dielectric film is performed in step 74. The second annealing is at a temperature higher than the crystallization temperature of the dielectric film and in an $O_2$ environment. For example, if the dielectric film is formed of the tantalum oxide, the second annealing is performed at a temperature between about 700° C. and about 900° C., preferably, 800° C., and the $O_2$ environment may contain a dry-$O_2$ or wet-$O_2$. Because the second annealing is at a temperature higher than steps 70 and 72, a furnace or rapid thermal processing (RTP) equipment is used for the second annealing.

Figure 5:
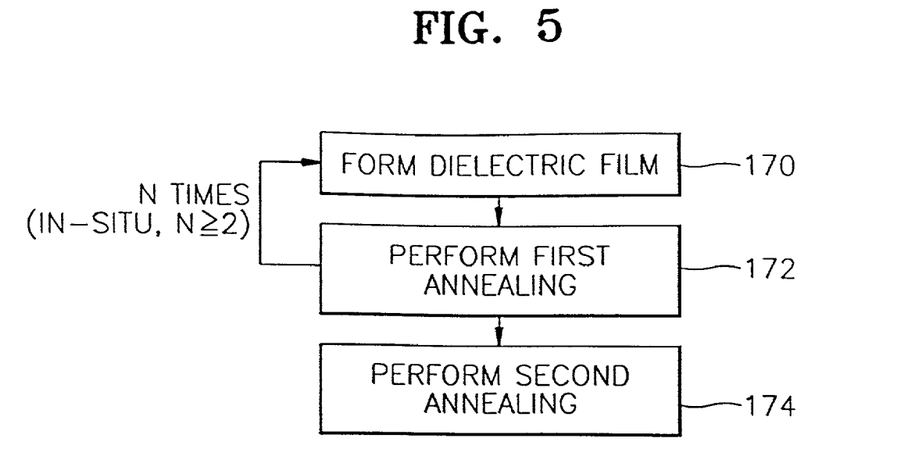

A method for forming and annealing of a dielectric film illustrated in FIG. 5 is similar to the method of FIG. 4. The process conditions of each step are identical between the methods in FIGS. 4 and 5. However, in the method of FIG. 5, the depositing and first annealing of the dielectric film (steps 170 and 172) are repeated N times in situ before the second annealing (step 174). N is equal to or greater than 2. In short, the method of FIG. 5 repeats step 170 and step 172 to form the dielectric film. For example, in order to form a 100 Å thick dielectric film, step 170 forms a 25 Å thick dielectric film, and step 172 anneals the film, and the steps 170 and 172 are repeated three times more. The second annealing (step 174) is the same as step 74 of FIG. 4.

Figure 6:
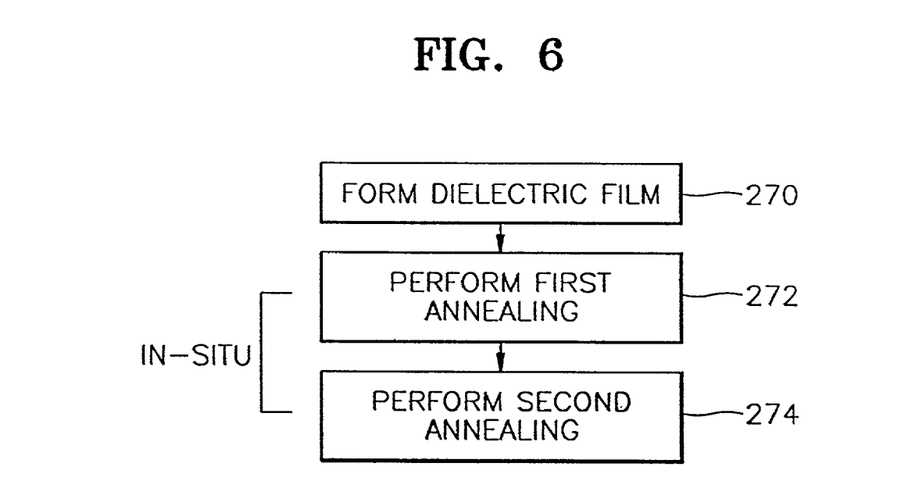

FIG. 6 illustrates another method for forming and annealing a dielectric film according to another embodiment of the present invention. Referring to FIG. 6, after forming the dielectric film (step 270), a first annealing (step 272) and a second annealing (step 274) are performed in situ in an $O_2$ environment. Since the second annealing (step 274) is performed at a temperature higher than the crystallization temperature of the dielectric film as described with reference to FIG. 4, steps 272 and 274 are performed in situ in a furnace or RTP equipment, not in a chamber where the dielectric film was formed.

If the dielectric film is tantalum oxide, step 270 forms a tantalum oxide film on a semiconductor substrate to a desired thickness, and steps 272 and 274 anneal the film in a furnace or RTP equipment. Step 272 is performed at between 500 and 700° C., preferably, 600° C., which is lower than the crystallization temperature of the tantalum oxide. Then, step 274 is performed in situ at between 700 and 900° C., preferably, 800 ° C., which is higher than the crystallization temperature of the tantalum oxide film. This two-step annealing can remove defects in the tantalum oxide film, e.g., oxygen vacancies and impurities, and crystallize the dielectric film. Crystallizing of the dielectric film may increase dielectric constant of the dielectric film but also increase the leakage current of the dielectric film. Thus, if it is not necessary to crystallize the dielectric film, a method described in FIG. 7 forms an amorphous dielectric film.

Figure 7:
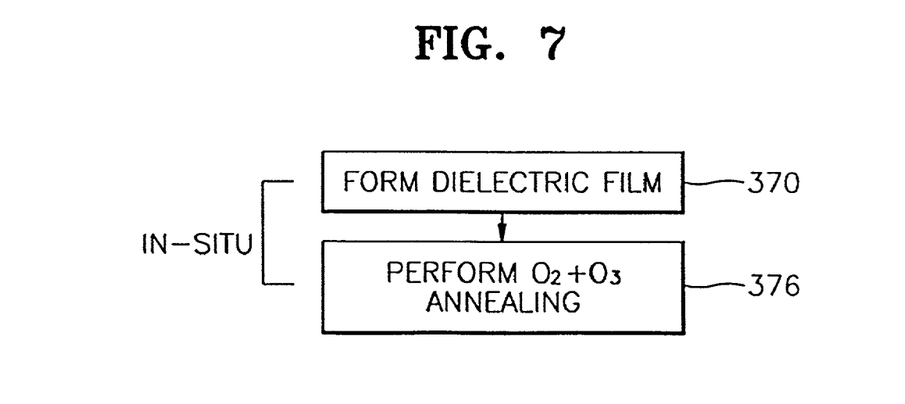

Referring to FIG. 7, step 370 deposits a dielectric film on a semiconductor substrate, and step 376 anneals the dielectric film in situ in the same chamber where the dielectric film was formed. Step 376 is not composed of a first and second annealing as in the methods of FIGS. 4 to 6, but a one-step annealing is performed in an environment containing ozone ($O_3$) and oxygen ($O_2$) gases at a temperature lower than the crystallization temperature of the dielectric film. For example, if the dielectric film is tantalum oxide and crystallizing of the tantalum oxide film is not necessary, step 376 anneals the tantalum oxide film at between 500 and 700° C., preferably, 600° C., which is lower than the crystallization temperature of the tantalum oxide. Step 376 is performed in an ozone ($O_3$) and oxygen ($O_2$) environment, preferably, the mixing ratio of $O_3$ to $O_2$ is about 9:1 to produce a similar annealing effect to the annealing performed at between 700 and 900° C. in an oxygen ($O_2$) environment.

Figure 8:
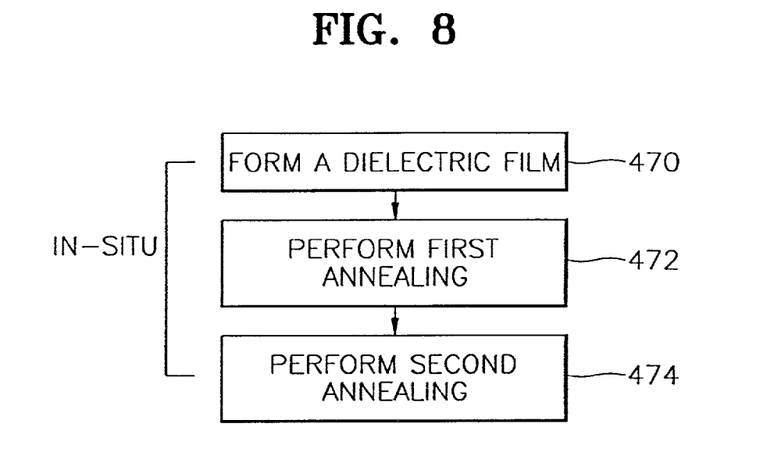

FIG. 8 illustrates another method for forming and annealing a dielectric film according to another embodiment of the present invention. Referring to FIG. 8, forming a dielectric film on a semiconductor substrate (step 470), a first annealing (step 472) and a second annealing (step 474) are performed in-situ in a chamber maintaining an $O_2$ environment. Step 472 is performed at a temperature lower than the crystallization temperature of the dielectric film. However, step 474 is performed at a temperature higher than the crystallization temperature of the dielectric film. If the dielectric film is a tantalum oxide, step 472 is performed at a temperature between 500 and 700° C., preferably about 600° C., and step 474 is performed at a temperature between 700 and 900° C., preferably about 800° C.

Figure 9:
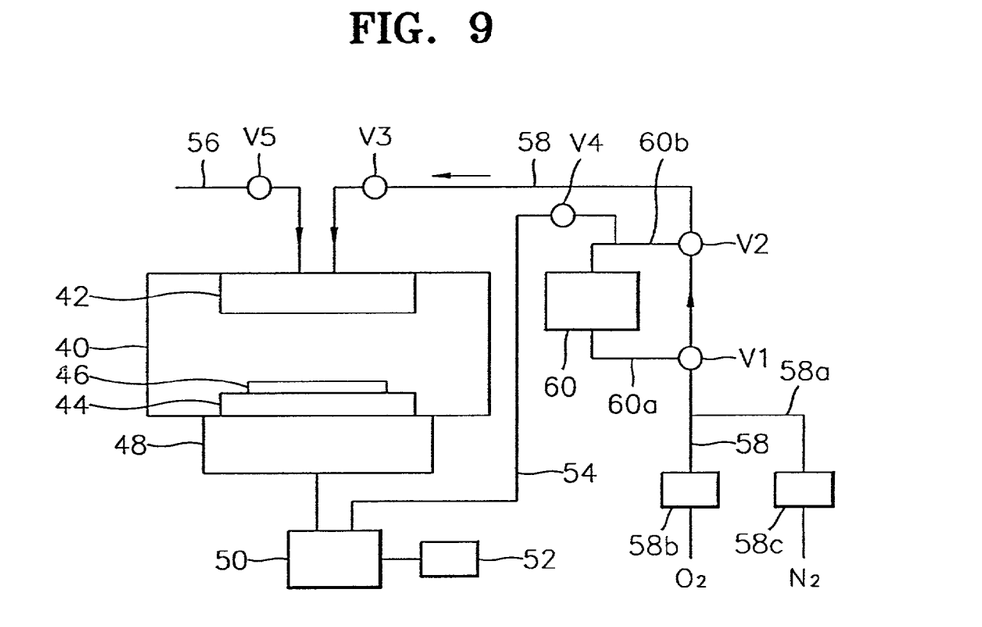
FIGS. 9 and 10 are partial sectional views of reaction chambers for forming thin films according to embodiments of the present invention.
Figure 10:
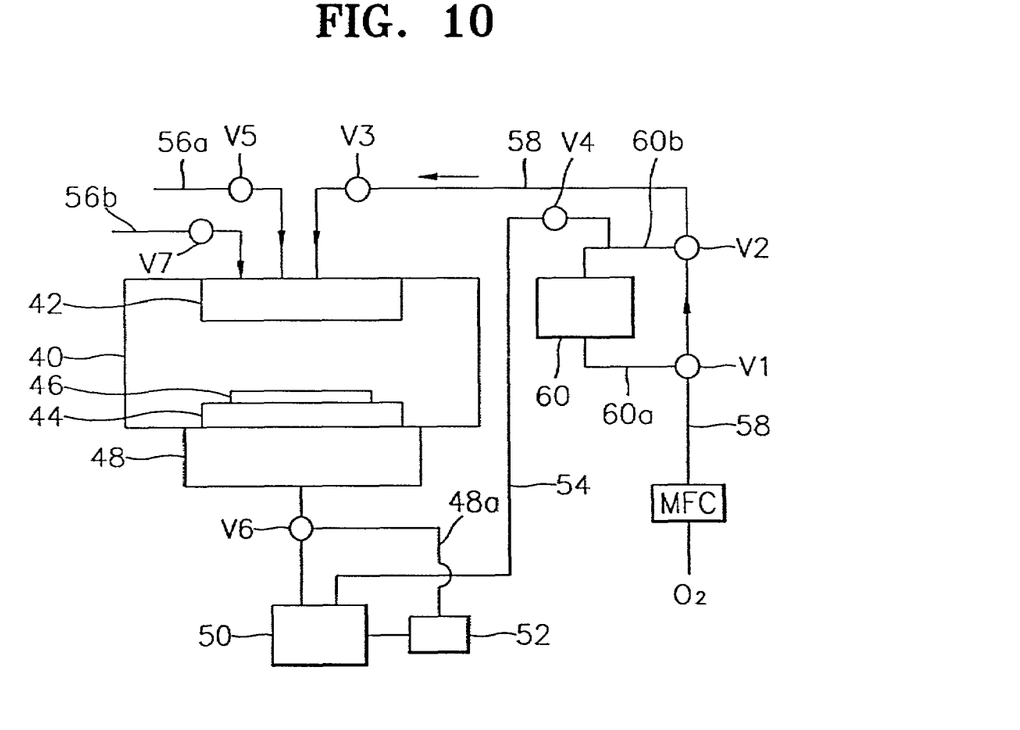
Figure 11:
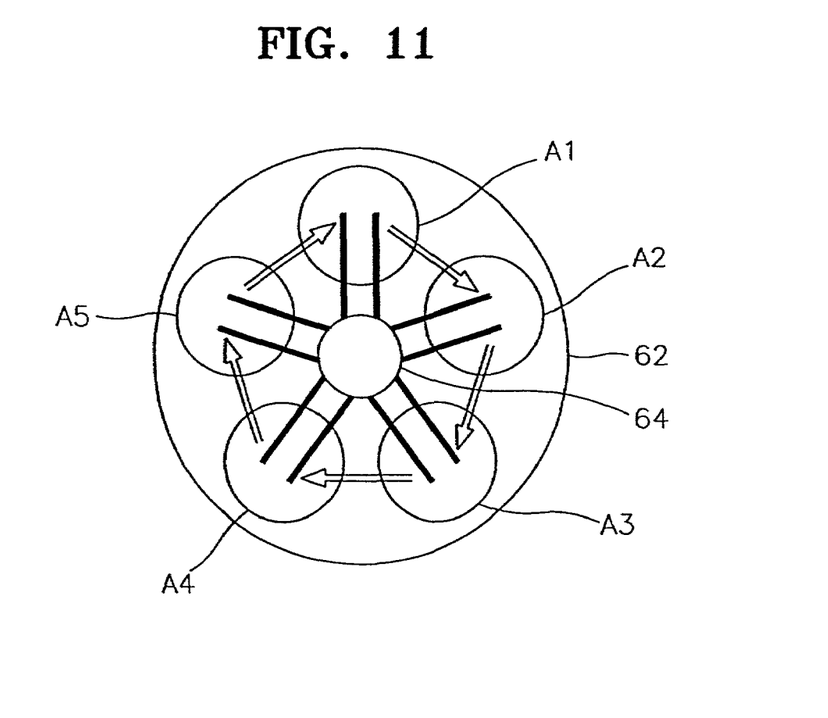
FIG. 11 is a partial plan view of a reaction chamber for forming a thin film according to another embodiment of the present invention.

Another aspect of the present invention provides apparatuses illustrated in FIGS. 9 to 11 for forming and annealing a dielectric film in situ.

FIG. 9 is a partial sectional view of a reaction chamber for forming a thin film according to an embodiment of the present invention. In FIG. 9, a quartz shower head 42 is on the ceiling of a chamber 40, a susceptor 44 for heating a semiconductor substrate 46 to a processing temperature is on the floor of the chamber 40 below the quartz shower head 42, and semiconductor substrate 46 is put on the susceptor 44. A pumping line 48 connects to the bottom of the reaction chamber 40 and to an ozone ($O_3$) decomposer 50. Ozone decomposer 50 connects to a pump 52. A turbo molecular pump (TMP) (not shown), which can change pressure within chamber 40, may connect to pump 52. A first gas supply line 56 and a second gas supply line 58 respectively connect to quartz shower head 42. A source gas for forming a thin film is injected into the chamber 40 via the first gas supply line 56. The source gas is a gas from a metal oxide group, e.g., the tantalum oxide group, titanium oxide group or aluminum oxide group. For example, pentaethoxytantalum ($Ta(OC_2H_5)_5$) is a source gas for a tantalum oxide. A reaction gas for depositing the thin film and an annealing gas for annealing the thin film are provided to chamber 40 through second gas supply line 58 and shower head 42. When the source gas is for a tantalum oxide thin film, the reaction gas and annealing gas are respectively $O_2$ and $O_3$.

Another gas supply line (not shown) may be between shower head 42 and an ozonizer 60 connected to second gas supply line 58, so that the reaction and annealing gases are supplied to chamber 40 through respective exclusive lines.

An inert gas supply line 58a, which supplies nitrogen ($N_2$) gas or argon (Ar) gas for purging of reaction chamber 40 and gas supply lines 56 and 58, connects to a part of second gas supply line 58 before ozonizer 60 connects to second gas supply line 58. Second gas supply line 58 and inert gas supply line 58a have first and second mass flow controllers (MFCs) 58b and 58c, respectively. An ozone purifying line 54 is between the ozonizer 60 and the ozone decomposer 50. One end of the ozone purifying line 54 connects to an output end 60b of the ozonizer 60, and the other end of ozone purifying line 54 connects to the ozone decomposer 50.

Second gas supply line 58 has three valves V1, V2 and V3, ozone purifying line 54 includes a valve V4, and first gas supply line 56 includes a valve V5. The ends of ozonizer 60 are connected to valves V1 and V2 of second gas supply line 58, respectively. That is, an input end 60a and output end 60b of ozonizer 60 respectively connect to valves V1 and V2.

FIG. 10 is a partial sectional view of a reaction chamber for forming a thin film according to another embodiment of the present invention.

Referring to FIG. 10, a second pumping line 48a is added to the apparatus of FIG. 9 between pumping line 48 and pump 52 so that second pumping line 48a bypasses ozone decomposer 50. Chamber 40 directly connects to pump 52 via second pumping line 48a, not through ozone decomposer 50. Thus, when ozone is not provided to chamber 40 and ozone purifying line 54, pump 52 can pump chamber 40 efficiently via second pumping line 48a, and prevent ozone decomposer 50 from contamination due to impurities from gas discharged during deposition of a dielectric film. Accordingly, the useful life of the ozone decomposer 50 is prolonged.

When installed, one end of second pumping line 48a connects to pump 52, and the other end to a valve V6 which controls the direction of gas flowing from chamber 40. That is, valve V6 can make the gas from chamber 40 flow into ozone decomposer 50 or along second pumping line 48a.

To form a composite dielectric film on the semiconductor substrate 46, the supply lines for source gases for the composite dielectric film, e.g., gas supply lines 56a and 56b, connect to shower head 42 of chamber 40. Gas supply lines 56a and 56b have valves V6 and V7, respectively. Two or more gas supplying lines may connect to shower head 42 according to the type of a composite dielectric film to be formed.

In contrast, in order to make a composite dielectric film, the apparatus of FIG. 10 may have one source gas supply line (not shown) instead of gas supply lines 56a and 56b, and a gas mixer (not shown) may be installed upstream of the source gas supply line. The gas mixer mixes multiple source gases and sends the mixed source gases into chamber 40 through the source gas supply line.

Figure 12:
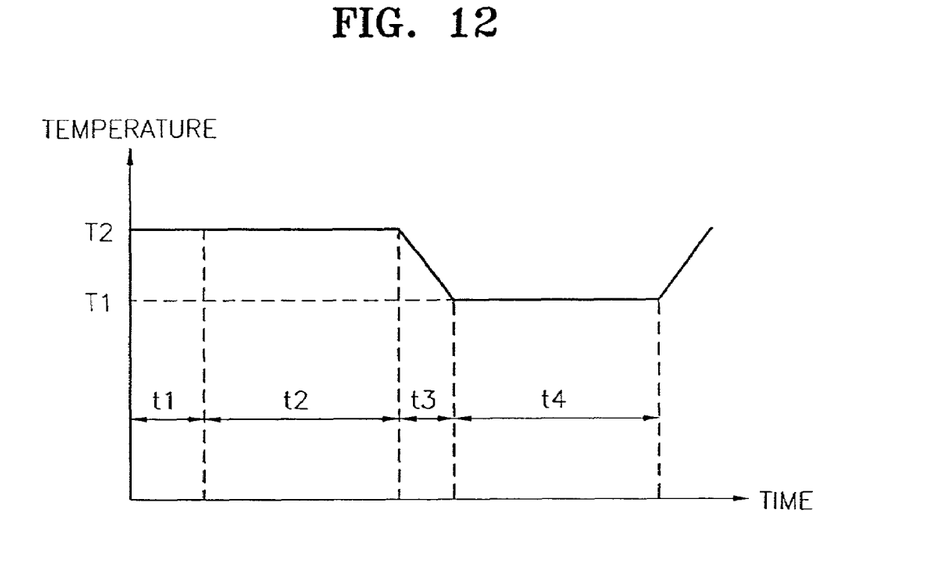
FIGS. 12 and 13 are graphs illustrating process recipes for thin film formation methods according to embodiments of the present invention.

Forming and annealing of a dielectric film is described in detail with reference to FIGS. 9 and 12.

In general, before formation of a thin dielectric film, a stabilization process stabilizes previously formed structures, such as transistors, on a semiconductor substrate at a thin film formation temperature, so that a following thin film formation process does not affect the previously formed structures.

Accordingly, after loading the semiconductor substrate 46 on the susceptor 44 of the reaction chamber 40, the stabilization process anneals semiconductor substrate 46 at a temperature T2 in an $N_2$ environment for a time t1. Typically, temperature T2 is between 400 and 600° C., preferably, about 480° C. After the stabilization, a thin film formation process starts. The thin film is typically a metal oxide film belonging to the tantalum oxide group, aluminum oxide group or titanium oxide group. A tantalum oxide film is preferable. Here, the thin film may be formed at between 480 and 500° C. and 0.3 Torr pressure.

In order to form a thin film, a source gas for deposition of the thin film, such as pentaethoxytantalum ($Ta(OC_2H_5)_5$), is supplied to reaction chamber 40 by opening valve V5 of first gas supply line 56 of FIG. 9. Simultaneously, a reaction gas, e.g., $O_2$ gas, is supplied to reaction chamber 40 by opening valves V1, V2 and V3 of second gas supply line 58. Valves V1 and V2 should be closed to ozonizer 60 to prevent the reaction gas from flowing into ozonizer 60. Semiconductor substrate 46 in reaction chamber 40 is maintained for a time t2 at a predetermined pressure, e.g., about 0.3 Torr, and a temperature T2 of FIG. 12, so that the thin film forms on semiconductor substrate 46. Time t2 depends on the thickness of the thin film to be formed.

When the thin film formation is complete, valve V1 opens to ozonizer 60 so that the oxygen is supplied to ozonizer 60. Here, since valve V2 is still closed to ozonizer 60, first ozone generated from ozonizer 60 is discharged to ozone decomposer 50 via ozone purifying line 54. Ozonizer 60 starts to generate $O_3$ before the thin film formation is complete to provide $O_3$ to reaction chamber 40 as soon as the thin film formation is complete. When the thin film formation is complete, valve V5 closes to stop supplying the source gas, and the ozone from ozonizer 60 remains at output end 60b of ozonizer 60 until the source gases and reaction byproducts are completely discharged from reaction chamber 40. During this discharge that continues for a time t3, the temperature of semiconductor substrate 46 drops from temperature T2 to a temperature T1. Temperature T1 is between 200 and 700° C., preferably, about 450° C.

After the discharge of the source gases and reaction byproducts, valve V4 closes and valve V2 opens, to supply an $O_2$ and $O_3$ gas mixture to reaction chamber 40 for an $O_3$ annealing of the thin film. Here, preferably, $O_2$ and $O_3$ gases are mixed at a ratio of 9:1. The $O_3$ annealing is performed for a time t4 at temperature T1. The annealing on the thin film is performed at between 200 and 700° C., preferably, about 450° C. Here, the pressure in reaction chamber 40 is maintained at approximately 30 Torr. Time t2 is preferably 2 minutes.

After the $O_3$ annealing of the thin film, valve V2 opens to chamber 40 and closes to ozonizer 60, valve V4 opens, and then $N_2$ (or $O_2$) gas is supplied to second gas supply line 58. As a result, the ozone remaining in second gas supply line 58 and chamber 40 is discharged. The ozone remaining in output end 60b of ozonizer 60 is discharged outside via ozone purifying line 54 and ozone decomposer 50.

When temperature T2 is different from temperature T1, a lamp heating method is preferred to a resistance heating method to improve productivity. However, when temperature T2 is similar to temperature T1, and the allowable range of the electrical characteristic values of the thin film is broad, the resistance heating method is preferred.

When a pressure difference between the thin film formation and the annealing is significant, a Turbo Molecular Pump (TMP) is employed to shorten the time required for shifting between the pressure for forming the above dielectric film and the pressure for annealing.

Figure 13:
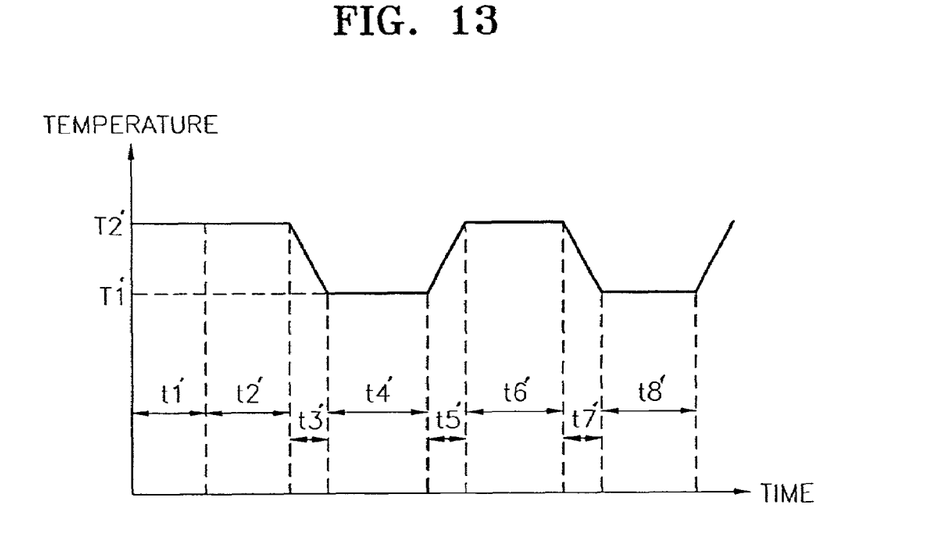

Next, dielectric film formation through multiple steps of forming and annealing of the dielectric film is described, with reference to FIGS. 9 and 13.

Referring to FIGS. 9 and 13, a stabilization process stabilizes semiconductor substrate 46 by annealing semiconductor substrate 46 at temperature T2' for a time t1'. Then, a first thin film forms on semiconductor substrate 46 at temperature T2' for a time t2'. After the first thin film formation is complete, the temperature of semiconductor substrate 46 falls from temperature T2' to temperature T1' during a time t3', and a first $O_3$ annealing at temperature T1' anneals the first thin film for a time t4'. After the first annealing, during a time t5', the ozone in reaction chamber 40 is purified, and the temperature of semiconductor substrate 46 is increased from temperature T1' to temperature T2'. A second thin film which is the same as the first thin film is formed on the first thin film for a time t6'. After the second thin film formation is complete, the temperature of semiconductor substrate 46 is lowered from temperature T2' to temperature T1' during a time t7'. Then, a second $O_3$ annealing anneals the second thin film for a time t8'. Then, ozone remaining in reaction chamber 40 is discharged from the reaction chamber.

The operation of the apparatus during depositing and annealing the first and second thin films is the same as the operation described above with reference to FIGS. 9 and 12. The deposition and annealing of first and second thin films are performed in situ in chamber 40.

FIG. 11 is a schematic plan view of a reaction chamber 62 according to still another embodiment of the present invention. Reaction chamber 62 can have the same attachments, such as the gas supply lines, the ozonizer, etc., as chamber 40 of FIG. 9 or 10. However, an internal structure of chamber 62 differs from that of chamber 40. While chamber 40 of FIGS. 9 and 10 can process one semiconductor substrate at a time, chamber 62 of FIG. 11 has multiple semiconductor substrate mounting stands A1, A2, A3, A4 and A5 for simultaneous processing of multiple semiconductor substrates. Each of semiconductor substrate mounting stands A1, A2, A3, A4 and A5 is equivalent to susceptor 44 of FIGS. 9 and 10.

Referring to FIG. 11, semiconductor substrate mounting stand A1 stabilizes a semiconductor substrate by a pre-heating, and semiconductor substrate mounting stands A2 to A5 deposit and anneal a dielectric film in situ. The dielectric film includes a metal oxide such as a tantalum oxide ($Ta_2O_5$), a titanium oxide ($TiO_2$), an aluminum oxide ($Al_2O_3$), an yttrium oxide, a vanadium oxide and a niobium oxide.

A fork assembly 64 placed at a center of chamber 62 transports the semiconductor substrates among semiconductor substrate mounting stands A1 to A5. The semiconductor substrates can simultaneously move in a direction indicated by arrows of FIG. 11.

Shower heads (not shown), which face the respective semiconductor substrate mounting stands A2 to A5, are on a ceiling of chamber 62. Each of the shower heads operates in the same way as the shower heads of FIGS. 9 and 10. Thus, $O_2$ or $O_3$ gas is supplied to each of semiconductor substrate mounting stands A1 and A2 via the shower heads. Chamber 62 includes a transfer module (not shown) having an aligning stage and a cooling stage. When a semiconductor substrate is loaded into chamber 62, the semiconductor substrate is aligned on the aligning stage and then loaded to semiconductor substrate mounting stand A1. When the semiconductor substrate is unloaded from reaction chamber 62 after a dielectric film deposition and annealing are complete, fork assembly 64 transports the semiconductor substrate from one of semiconductor substrate mounting stands A2 to A5 to the cooling stage.

Chamber 62 further includes a spray means capable of flowing an inert gas such as nitrogen around each shower head, to form a gas curtain isolating semiconductor substrate mounting stands A1 to A5 from one another. For the spray means, each shower head may include an additional inlet for inert gas that is supplied to gas outlets formed at the edge of the shower head.

An exemplary operation of chamber 62 in forming and annealing a 100Å thick dielectric film is described.

A first semiconductor substrate is loaded on semiconductor substrate mounting stand A1 from the aligning stage and pre-heated. Then, fork assembly 64 transports the first semiconductor substrate to semiconductor substrate mounting stand A2, and a second semiconductor substrate is loaded on empty semiconductor substrate mounting stand A1.

While the second semiconductor substrate is pre-heated on semiconductor substrate mounting stand A1, a tantalum oxide film forms to a thickness of 25 Å on the first semiconductor substrate on semiconductor substrate mounting stand A2. Subsequently, the tantalum oxide film is annealed at a temperature lower than the crystallization temperature of the tantalum oxide film, preferably, about 450° C. Then, fork assembly 64 transports the second and first semiconductor substrates respectively from semiconductor substrate mounting stands A1 and A2 to semiconductor substrate mounting stands A2 and A3, and loads a third semiconductor substrate to empty semiconductor substrate mounting stand A1. While the third semiconductor substrate is pre-heated, a tantalum oxide film forms on the second semiconductor substrate to a thickness of 25Å, and the tantalum oxide film on the first semiconductor substrate becomes 50Å. A subsequent annealing anneals the first and second semiconductor substrates. Then, fork assembly 64 transports the third, second and first semiconductor substrates respectively from semiconductor substrate mounting stands A1, A2 and A3 to semiconductor substrate mounting stands A2, A3 and A4, and loads a fourth semiconductor substrate to empty semiconductor substrate mounting stand A1. While the fourth semiconductor substrate is pre-heated, a tantalum oxide film forms on the third semiconductor substrate to a thickness of 25Å, and the tantalum oxide films on the first and second semiconductor substrates respectively become 75Å and 50Å. A subsequent annealing anneals the first, second and third semiconductor substrates. Then, fork assembly 64 transports the fourth, third, second and first semiconductor substrates respectively from semiconductor substrate mounting stands A1, A2, A3 and A4 to semiconductor substrate mounting stands A2, A3, A4 and A5, and loads a fifth semiconductor substrate to empty semiconductor substrate mounting stand A1. Again, while the fifth semiconductor substrate is pre-heated, a tantalum oxide film forms on the fourth semiconductor substrate to a thickness of 25Å, and the tantalum oxide films on the first, second and third semiconductor substrates respectively become 100Å, 75Å and 50Å. A subsequent annealing anneals the first, second, third and fourth semiconductor substrates. Then, fork assembly 64 transports the first, second, third, fourth and fifth semiconductor substrates respectively from semiconductor substrate mounting stands A5, A4, A3, A2 and A1 to semiconductor substrate mounting stands A1, A5, A4, A3 and A2. Next, fork assembly 64 transports the first semiconductor substrate having the 100Å thick tantalum oxide film from semiconductor substrate mounting stand A1 to the cooling stage, and loads a sixth semiconductor substrate to empty semiconductor substrate mounting stand A1. The second to sixth semiconductor substrates subsequently go through the same steps as the first semiconductor substrate. As described above, the forming and annealing of the dielectric films can be formed in situ on multiple semiconductor substrates.

Reaction chamber 62 can operate in another way where dielectric film deposition and annealing are performed on respective exclusive semiconductor substrate mounting stands. For example, the deposition process is performed only on semiconductor substrate mounting stands A2 and A4, and the annealing process is performed only on semiconductor substrate mounting stands A3 and A5. For this kind of operation, at least three exclusive semiconductor substrate mounting stands are required for pre-heating, dielectric film formation, and dielectric film annealing, respectively. It is preferable that a reaction chamber includes the same number of semiconductor substrate mounting stands exclusively for the dielectric film formation as those exclusively for the dielectric film annealing.

Referring FIG. 11, the operation of chamber 62 having exclusive semiconductor substrate mounting stands is described.

A semiconductor substrate is loaded from the aligning stage to semiconductor substrate mounting stand A1, pre-heated, and then transported to semiconductor substrate mounting stand A2. When the shower head supplies source and reaction gases, a dielectric film forms on the semiconductor substrate before the semiconductor substrate is transported to semiconductor substrate mounting stand A3 and annealed using $O_2$ or $O_3$ gas. In order to make the dielectric film thicker, the semiconductor substrate is transported to semiconductor substrate mounting stand A4 for an additional dielectric film formation and to semiconductor substrate mounting stand A5 for an $O_2$ or $O_3$ annealing. In forming the dielectric film on semiconductor substrate mounting stand A2 or A4, valves V1' and V2'(not shown), equivalent to valves V1 and V2 of FIG. 9 or 10, operate to supply the source and reaction gases. That is, valves V1' and V2' are closed to an ozonizer (not shown) and open to reaction chamber 62. In contrast, the shower heads above substrate mounting stand A3 and A5 supply only a gas for annealing the dielectric film.

Preferably, in forming a dielectric film using reaction chamber 62, the time for a each dielectric film formation is almost the same as that for each dielectric film annealing, and the pressures and temperatures between the dielectric film formation and annealing are so similar to each other that the formation on one semiconductor substrate mounting stand does not affect the annealing on another semiconductor substrate mounting stand, and vice versa.

In addition, reaction chamber 62 can be operated such that four semiconductor substrates are loaded to semiconductor substrate mounting stands A2 to A5, and dielectric film forming and annealing are performed on each semiconductor substrate. Here, the dielectric film forming and annealing can be performed through multiple steps. Chamber 62 can have multiple source gas supply lines like chamber 40 of FIG. 10.

Referring to FIGS. 9 and 10, valve V1 can be replaced with three valves: one before valve V1, a second one after valve V2 and a third one at input end 60a of ozonizer 60.

Although described with reference to forming a dielectric film, aforementioned embodiments of the present invention can be applied to forming other films including insulating or conductive films.

The in situ formation and annealing of a dielectric film of a semiconductor device according to the present invention reduces the total time required to produce the dielectric film, and thus increases a productivity of a process manufacturing the semiconductor device. In addition, the in situ formation and annealing can prevent contamination of the film with impurities encountered when transporting the semiconductor device between equipment for dielectric film formation and equipment for dielectric film annealing. The invention integrates a reaction chamber for forming a dielectric film and another reaction chamber for annealing the dielectric film into one reaction chamber.

While the present invention has been illustrated and described with reference to specific embodiments, further modifications and alterations within the spirit and scope of this invention will occur to those skilled in the art.

What is claimed is:

1. A method for forming a dielectric film comprising:
   (a) forming a metal oxide film on a substrate;
   (b) first annealing the metal oxide film under a first oxidizing gas ambient at a first temperature, the first temperature being lower than a crystallization temperature of the metal oxide film; and
   (c) second annealing the metal oxide film under a second oxidizing gas ambient at a second temperature, the second temperature being higher than the crystallization temperature of the metal oxide film,
   wherein the steps (a) and (b) are performed in situ in a chamber, steps (a), (b), and (c) are consecutively performed, and the first oxidizing gas ambient and the second oxidizing gas ambient have different gas compositions.

2. The method of claim 1, wherein the dielectric film comprises a material selected from a group consisting of tantalum oxide, titanium oxide, aluminum oxide, yttrium oxide, vanadium oxide and niobium oxide.

3. The method of claim 2 wherein the dielectric film comprises tantalum oxide, and the first annealing is performed at the first temperature between 200 and 700° C. and the first oxidizing gas ambient includes both ozone and oxygen.

4. The method of claim 2 wherein the dielectric film comprising tantalum oxide, and the second annealing is performed at the second temperature between 700 and 900° C. and the second gas ambient includes oxygen and is substantially free of ozone.

5. The method of claim 1, wherein the chamber comprises a shower head in the chamber, and a susceptor in the chamber for heating the substrate, wherein a first gas supply line for supplying a source gas for forming the dielectric film and a second gas supply line for supplying a reaction gas for forming the dielectric film and an annealing gas connect to the shower head.

6. The method of claim 5, wherein the source gas is selected from a group consisting of a gas in a tantalum oxide group, a gas in a titanium oxide group and a gas in an aluminum oxide group.

7. The method of claim 5, wherein the reaction gas is oxygen and the annealing gas is a mixture containing ozone and oxygen.

8. The method of claim 7, wherein the mixture comprises oxygen and ozone gases in a volume ratio of about 9:1.

9. The method of claim 1, wherein the steps (a) and (b) employ a lamp heating method.

10. The method of claim 1, wherein a turbo molecular pump is used to change pressure in the chamber during a transition from the step (a) to the step (b).

11. method of claim 1, wherein the chamber comprises a plurality of substrate mounting stands.

12. The method of claim 11 wherein the steps (a) and (b) comprises:
pre-heating the substrate on a first of the substrate mounting stands;
transporting the substrate to a second of the substrate mounting stands; and
forming the film on the substrate while the substrate is on the second substrate mounting stand.

13. The method of claim 12, further comprising annealing the film while the substrate is on the second substrate mounting stand.

14. The method of claim 12, further comprising:
transporting the substrate having the film formed thereon to a third of the substrate mounting stands; and
annealing the film on the substrate on the third substrate mounting stand.

15. The method of claim 1 further comprising discharging a gas from the chamber between steps (b) and (c).

16. A method for forming a dielectric film comprising:
(a) forming a metal oxide film on a substrate;
(b) first annealing the metal oxide film at a first temperature under a first oxidizing gas ambient, the first temperature being lower than a crystallization temperature of the metal oxide film; and
(c) second annealing the metal oxide film at a second temperature under a second oxidizing gas ambient, the second temperature being higher than the crystallization temperature of the metal oxide film,
wherein the steps (b) and (c) are performed in situ in an apparatus, steps (a), (b), and (c) are consecutively performed and the first oxidizing gas ambient and the second oxidizing gas ambient have different gas compositions.

17. The method of claim 16, wherein the step (c) is performed at between 500 and 700° C. in an oxygen atmosphere using the furnace.

18. method of claim 16, wherein the step (c) is performed at between 700 and 900° C. in an oxygen atmosphere using the furnace.

19. The method of claim 16, wherein the steps (a), (b) and (c) are performed in situ in the apparatus.

20. The method of claim 16 further comprising discharging a gas from the chamber between steps (b) and (c).

21. A method for forming a dielectric film comprising:
(a) forming a metal oxide film on a substrate;
(b) performing a first anneal of the metal oxide film under a first oxidizing gas composition at a first annealing temperature, the first annealing temperature being lower than a crystallization temperature of the metal oxide film, wherein the combination of the first oxidizing gas composition and the first annealing temperature are sufficient to remove a majority of defects from the metal oxide film to form a treated metal oxide film; and
(c) performing a second anneal on the treated metal oxide film under a second oxidizing gas composition at a second annealing temperature, the second annealing temperature being higher than the crystallization temperature of the metal oxide film, wherein the second anneal is the first thermal process performed on the treated metal oxide film;
wherein the steps (a) and (b) are performed in situ in a single chamber, steps (a), (b), and (c) are consecutively performed, wherein the first oxidizing gas composition includes a higher ozone content than the second oxidizing gas composition, and further wherein the first and second annealing cooperate to reduce a leakage current by at least two orders of magnitude.

* * * * *